US010600656B2

(12) United States Patent
Joseph et al.

(10) Patent No.: US 10,600,656 B2
(45) Date of Patent: Mar. 24, 2020

(54) DIRECTED SELF-ASSEMBLY FOR COPPER PATTERNING

(71) Applicant: International Business Machines Corporation, Armonk, NY (US)

(72) Inventors: Eric A. Joseph, White Plains, NY (US); Hiroyuki Miyazoe, White Plains, NY (US); Adam M. Pyzyna, Cortlandt Manor, NY (US); HsinYu Tsai, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/818,947

(22) Filed: Nov. 21, 2017

(65) Prior Publication Data

US 2019/0157106 A1 May 23, 2019

(51) Int. Cl.
| *H01L 21/00* | (2006.01) |
|---|---|
| *H01L 21/3213* | (2006.01) |
| *H01L 23/532* | (2006.01) |
| *H01L 23/528* | (2006.01) |
| *H01L 21/768* | (2006.01) |
| *H01L 27/24* | (2006.01) |

(52) U.S. Cl.
CPC .. *H01L 21/32139* (2013.01); *H01L 21/32136* (2013.01); *H01L 21/76886* (2013.01); *H01L 23/528* (2013.01); *H01L 23/53238* (2013.01); *H01L 27/2463* (2013.01)

(58) Field of Classification Search
None
See application file for complete search history.

(56) References Cited

U.S. PATENT DOCUMENTS 8,546,785 B2 * 10/2013 Yang .................. H01L 27/2463
257/2
8,711,351 B1 4/2014 Gibson et al.
(Continued)

FOREIGN PATENT DOCUMENTS

WO 2013/120052 A1 8/2013

OTHER PUBLICATIONS

Rossnagel et al., "Alteration of Cu conductivity in the size effect regime," Journal of Vacuum Science & Technology B, Nanotechnology and Microelectronics: Materials, Processing, Measurement, and Phenomena, vol. 22, No. 1, Jan./Feb. 2004, pp. 240-247. DOI: 10.1116/1.1642639.

(Continued)

*Primary Examiner* — Reema Patel
(74) *Attorney, Agent, or Firm* — Kelsey M. Skodje (57) ABSTRACT

A process for forming patterned copper lines, a pattern of copper lines, and an electronic device having patterned copper lines and at least one CMOS circuit. The process includes assembling an etch stack, wherein the etch stack includes a resist and a copper substrate. The process also includes lithographically patterning the resist to produce a template, and forming a patterned block copolymer mask layer by directed self-assembly. Additionally, the process includes etching portions of the block copolymer mask layer to produce a patterned block copolymer mask layer, and transferring a pattern formed by the template and the patterned block copolymer mask layer to the copper substrate to form the patterned copper lines.

10 Claims, 4 Drawing Sheets

(56) References Cited

U.S. PATENT DOCUMENTS

| | | | |
|---|---|---|---|
| 8,859,433 B2 | 10/2014 | Abdallah et al. | |
| 8,993,404 B2 | 3/2015 | Kobrinsky et al. | |
| 9,117,822 B1 | 8/2015 | Singh et al. | |
| 9,169,383 B2 | 10/2015 | Farnham et al. | |
| 9,236,292 B2 | 1/2016 | Romero et al. | |
| 9,472,499 B2 | 10/2016 | Chang et al. | |
| 9,493,879 B2 | 11/2016 | Hoinkis et al. | |
| 9,601,546 B1 | 3/2017 | Ando et al. | |
| 9,666,528 B1* | 5/2017 | Bergendahl | H01L 23/5256 |
| 2005/0029669 A1* | 2/2005 | Inoue | H01L 21/76852 257/774 |
| 2005/0239221 A1* | 10/2005 | Feng | H01L 22/20 438/14 |
| 2013/0288482 A1* | 10/2013 | Nam | H01L 21/0273 438/703 |
| 2014/0252630 A1 | 9/2014 | Chang et al. | |
| 2015/0195916 A1* | 7/2015 | Cheng | G03F 7/0002 216/47 |
| 2015/0279780 A1* | 10/2015 | Zhang | H01L 21/7681 257/774 |

OTHER PUBLICATIONS

Wong et al., "Metal-Oxide RRAM," Proceedings of the IEEE, vol. 100, Issue 6, Jun. 2012, pp. 1951-1970. DOI: 10.1109/JPROC.2012.2190369.

Tsai et al., "Pattern transfer of directed self-assembly patterns for CMOS device applications," Journal of Micro/Nanolithography, MEMS, and MOEMS, vol. 12, No. 4, Oct.-Dec. 2013, 041305, pp. 1-6.

Tsai et al., "Sub-30 nm pitch line-space patterning of semiconductor and dielectric materials using directed self-assembly," Journal of Vacuum Science & Technology B, Nanotechnology and Microelectronics: Materials, Processing, Measurement, and Phenomena, vol. 30, No. 6, Nov./Dec. 2012, pp. 06F205-1-06F205-6.

Tsai et al., "Two-Dimensional Pattern Formation Using Graphoepitaxy of PS-b-PMMA Block Copolymers for Advanced FinFET Device Circuit Fabrication," ACS Nano, vol. 8, No. 5, 2014, pp. 5227-5232.

Tsai et al., "High chi block copolymer DSA to improve pattern quality for FinFET device fabrication," Proceedings of SPIE vol. 9779, Advances in Patterning Materials and Processes XXXIII, 977910, 2016, pp. 1-7. DOI: 10.1117/12.2219544.

Miyazoe et al., "Fine patterning of copper by plasma etch process for advanced BEOL interconnects," AVS 60th International Symposium & Exhibition, PS-MoA-6, 2013, pp. 1-19.

Joseph et al., "Selective Sputtering with Light Mass Ions to Sharpen Sidewall of Subtractively Patterned Conductive Metal Layer," U.S. Appl. No. 15/192,196, filed Jun. 24, 2016.

Hoinkis et al., "Selective Sputtering for Pattern Transfer," U.S. Appl. No. 61/845,444, filed Jul. 12, 2013.

Bruce et al., "Interconnect Structure Including Airgaps and Subtractively Etched Metal Lines," U.S. Appl. No. 15/405,440, filed Jan. 13, 2017.

Ando et al., "Crossbar Resistive Memory Array with Highly Conductive Copper/Copper Alloy Electrodes and Silver/Silver Alloys Electrodes," U.S. Appl. No. 15/473,922, filed Mar. 30, 2017.

* cited by examiner

DIRECTED SELF-ASSEMBLY FOR COPPER PATTERNING

BACKGROUND

The present disclosure relates to directed self-assembly, and more specifically to directed self-assembly-based formation of copper lines.

Patterned copper lines can be interconnects and crossbar arrays. For example, copper crossbar arrays are used in random-access memory (RAM) (e.g., RRAM, CBRAM, PCRAM, etc.) applications. An example of a crossbar array is an array core comprising multiple units of RRAM cells. In neuromorphic computing, RRAM devices can act as connections between pre-neurons and post-neurons. Multiple pre-neurons and post-neurons can be connected through an RRAM crossbar array. Patterned copper lines are also used as interconnects in applications such as integrated circuits.

SUMMARY

Various embodiments are directed to a process for patterning copper. The process can include assembling an etch stack, wherein the etch stack includes mask materials patterned with directed self-assembly and a copper substrate. The process can also include lithographically patterning the resist to produce a template, and forming a patterned block copolymer mask layer by directed self-assembly. Additionally, the process can include etching portions of the block copolymer mask layer to produce a patterned block copolymer mask layer, and transferring a pattern formed by the template and the patterned block copolymer mask layer to the copper substrate to form the patterned copper lines. The etch stack can also include a dielectric layer, a liner layer, a barrier layer, a hardmask, and an organic planarizing layer, which can be amorphous carbon. The etching can include reactive ion etching steps and plasma-based etching steps, such as $O_2$-based plasma etching. The hardmask can made of a material such as silicon, titanium nitride, titanium oxides, titanium oxynitrides, tantalum nitride, hafnium oxides, niobium nitride, lanthanum oxide, silicon oxides, silicon oxynitrides, zirconium oxides, and tin oxides. The block copolymer mask layer can be a lamellae-forming block copolymer, such as poly(styrene)-poly(methyl methacrylate), poly(styrene)-b-poly(methyl methacrylate), and poly(ethylene oxide)-poly(lactic acid), and a high chi block copolymer. Additionally, the patterned copper lines formed in the process can be integrated with at least one complementary metal-oxide-semiconductor circuit.

Further embodiments are directed to patterned copper lines, wherein the patterned copper lines is formed in an etch process involving directed self-assembly. The process can include assembling an etch stack, wherein the etch stack includes a resist (e.g., a photosensitive resist) and a copper substrate. The process can also include lithographically patterning the resist to produce a template, and forming a patterned block copolymer mask layer by directed self-assembly. Additionally, the process can include etching portions of the block copolymer mask layer to produce a patterned block copolymer mask layer, and transferring a pattern formed by the template and the patterned block copolymer mask layer to the copper substrate to form the patterned copper lines. The patterned copper lines can be a crossbar array, which can be in a memory device. The patterned copper lines can also be interconnects. Further, the patterned copper lines can have a pitch that is 70 nm or less.

Additional embodiments are directed to an electronic device. The electronic device can comprise at least one complementary metal-oxide-semiconductor circuit and patterned copper lines. The patterned copper lines can be formed in a process that includes assembling an etch stack, wherein the etch stack includes a resist (e.g., a photosensitive resist) and a copper substrate. The process can also include lithographically patterning the resist to produce a template, and forming a patterned block copolymer mask layer by directed self-assembly. Additionally, the process can include etching portions of the block copolymer mask layer to produce a patterned block copolymer mask layer, and transferring a pattern formed by the template and the patterned block copolymer mask layer to the copper substrate to form the patterned copper lines. The electronic device can be a memory device or a neuromorphic computer system. Additionally, the patterned copper lines can have a pitch that is less than 29 nm.

DETAILED DESCRIPTION

Advances in complementary metal-oxide-semiconductor (CMOS) technology continue to cause feature sizes to decrease, allowing for greater computing power in smaller devices. However, Moore's law predicts that computation using current materials and von Neumann architecture will reach a fundamental limit within the next decade. Therefore, new materials and computing architectures are of great interest today. An example of a promising new computer architecture can be found in neuromorphic computing. Neuromorphic architecture uses very-large-scale integration (VLSI) systems having electronic analog circuits to mimic the neurobiological architecture of the nervous system. The size of integrated circuits could be reduced by using smaller (e.g., tighter or lower pitched) copper interconnects. Further, smaller copper crossbar arrays would allow the size of memory devices to be reduced. Random access memory (RAM) applications that use copper crossbar arrays can include phase-change memory (PCRAM), resistive RAM (RRAM), ferroelectric RAM (FeRAM), conductive-bridging RAM (CBRAM), magnetoresistive RAM (MRAM), etc.

In a neuromorphic computer system, pre-neurons and post-neurons can be connected by resistive random access memory (RRAM) devices (i.e., synapses). A fully connected neural network can be formed by connecting multiple pre-neurons and post-neurons through a crossbar array of RRAM devices. The most powerful examples of artificial neural networks can contain more than one million ($10^6$) neurons and one billion ($10^9$) synapses. For comparison, the human brain possesses approximately one hundred billion ($10^{11}$) neurons and one quadrillion ($10^{15}$) synapses. Therefore, significant advances in computation, manufacturing, and materials are required before artificial neural networks reach the processing capabilities of a human brain. However, it is becoming increasingly difficult to manufacture metal interconnects on the same scale as rapidly shrinking CMOS circuits.

Improvements to conventional manufacturing techniques that would reduce the size of patterned copper lines would enhance the compatibility of the synapses and crossbar arrays with current and future CMOS circuits. For example, there is a desire for crossbar arrays and interconnects scaled down to approximately 10 nm for integration with CMOS circuits. Crossbar arrays of this size could be used to produce memory devices for neuromorphic computing, as well as for high-density and high-speed non-volatile memory applications. However, current crossbar arrays with competitive memory density generally have a size of approximately 20 nm and a pitch at or below approximately 40 nm.

A low resistivity metal is required for large scale RAM crossbar arrays. Low copper (Cu) resistivity can be achieved by growing large-grain copper films, and etching tight pitch lines to pattern the copper lines. However, current methods for forming patterned copper lines (e.g., crossbar arrays and interconnects) have not produced separated copper lines having a pitch less than approximately 30 nm. Patterned copper lines are conventionally formed via damascene processes, wherein patterned trenches are filled with copper. Unfortunately, damascene processes often result in undesirable effects when scaled down, such as poor liner/seed coverage on the trench walls, pinch-off at the trench mouth, and reentrant reactive ion etch (RIE) profiles. Further, when the ratio of liner to copper increases, copper grain growth and copper grain scattering phenomena can occur, resulting in resistivity levels that make the copper a less effective interconnect material.

Other patterning techniques are similarly unable to achieve tighter patterned copper lines. For example, extreme ultraviolet (EUV) lithography has future potential in this area, but has not yet been successful at producing effective copper lines. Additionally, multiple-patterning processes (e.g., self-aligned double patterning (SADP), self-aligned quadruple patterning (SAQP), lino-etch-lino-etch (LELE), etc.) often result in misalignments that cause the pitch to alternate between features (i.e., pitch walking). Therefore, new methods for copper patterning are needed in order to produce patterned copper lines for applications such as crossbar arrays and interconnects.

A process for producing patterned copper lines with pitches of 70 nm or less (e.g., approximately 70 nm-5 nm) is disclosed herein. These lines are fabricated using directed self-assembly (DSA) and etching techniques. DSA is a way of manufacturing micro- and nanoscale materials and devices by integrating self-assembling materials (e.g., lamellae-forming block copolymers) into traditional manufacturing processes. Block copolymers (i.e., copolymers comprising blocks of different polymerized monomers) having dissimilar non-intermixing blocks self-segregate into homogeneous block domains having a lamellar structure. DSA patterning techniques can be used to direct the domains to assemble into well-defined and highly regular patterns. Examples of block copolymers and DSA patterning techniques are discussed in greater detail below. The block copolymer patterns can then be lithographically transferred to a substrate (e.g., silicon, copper, gold, etc.).

Figure 1:
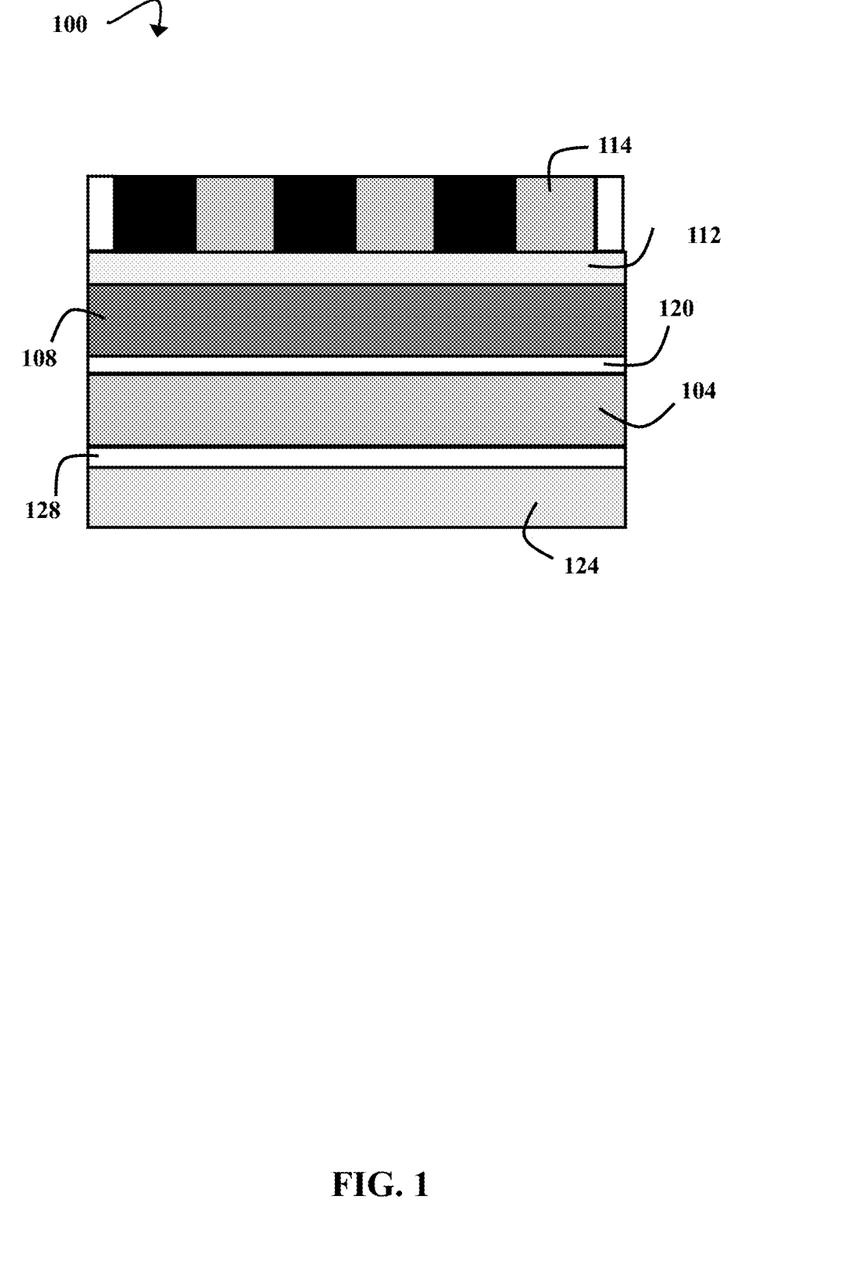
FIG. 1 is a schematic diagram illustrating a generic trilayer etch stack having a copper substrate, according to some embodiments of the present disclosure.

FIG. 1 is a schematic diagram illustrating a generic trilayer etch stack 100 having a copper substrate 104, according to some embodiments of the present disclosure.

The trilayer etch stack 100 includes three layers stacked on the copper substrate 104. These layers are an organic planarization layer (OPL) 108, a hard mask layer 112, and an image formation layer 114. Additionally, a tantalum nitride (TaN) barrier 120 is disposed between the copper substrate 104 and the OPL 108. A dielectric material 124 lined with a liner layer 128 of cobalt (Co) or TaN provides a base for the trilayer etch stack 100. It should be noted that layers and materials can be added to or omitted from the etch stack 100 in some embodiments, as would be understood by a person of ordinary skill in the art.

In some embodiments, the dielectric layer 124 is made from a material that is, or has as a precursor, a silicon-containing compound, such as SiCOH, porous SiCOH, SiCH, or SiCNH. The dielectric layer can also be a silicon-containing compound such as tetramethyl cyclotetrasiloxane, octamethyl cyclotetrasiloxane, tetraethyl orthosilicate, triethoxy silane, Diethoxy silane, triphenyl ethoxysilane, 1-(triethoxysilyl)-2-(diethoxymethylsilyl)ethane, tri-t-butoxylsilanol, tetramethoxy silane, tetramethylsilane, tetraethoxysilane, octamethyltetrasiloxane, etc.) combined with an oxidant (e.g., ozone, hydrogen peroxide, oxygen, water, and alcohols). Additionally, the dielectric layer 124 can be an organic dielectric (e.g., a thermosetting polyarylene ether).

Examples of conventional methods for depositing the dielectric layer 124 onto a surface can include chemical vapor deposition (CVD), plasma enhanced chemical vapor deposition (PECVD), high density PECVD, photon-assisted CVD, plasma-photon-assisted CVD, cryogenic CVD, evaporation, chemical assisted vapor deposition, hot-filament CVD, CVD of a liquid polymer precursor, deposition from supercritical fluids, transport polymerization, spin coating, dip coating, and Langmuir-Blodgett self-assembly. In some embodiments, the dielectric layer 124 has a thickness within a range of approximately 50 nm to approximately 500 nm, though greater or lesser thicknesses could also be used.

The liner layer 128 is deposited onto the dielectric layer 124, and prevents diffusion of copper from the copper substrate 104 into the dielectric material 124. The liner layer 128 can also improve adhesion of the copper substrate 104 to the dielectric material 124. In some embodiments, the liner layer 128 is Co or TaN. However, the liner layer 128 can also be another metal (e.g., Ta, Ti, Ru, Jr, and/or W), and/or a metal nitride thereof (e.g., TiN or WN). For example, a layer of Ta could be deposited on the dielectric material 104, followed by introduction of a nitrogen (N) source to form TaN in the upper portion of the liner layer 128. In some embodiments, the liner layer has a thickness within a range of approximately 1 nm to approximately 5 nm. However, the thickness can also be within a range of approximately 0.05 nm to approximately 25 nm.

The copper substrate 104 is deposited onto the surface of the liner layer 128. Processes for depositing the copper can include electrochemical deposition (i.e., electroplating), e-beam evaporative deposition, physical vapor deposition, and CVD. The deposited copper can be annealed at temperatures ranging from approximately 200° C. to approximately 500° C. in order to increase the grain size. In some embodiments, a planarization process (e.g., chemical mechanical planarization (CMP)) is carried out on the copper substrate 104. In some embodiments, the copper layer has a thickness within a range of approximately 10 nm to 100 nm. The TaN barrier 120 is formed on the copper substrate 104 surface. However, in some embodiments this barrier cap 120 is made of another metal or metal nitride (e.g., Ta, Ti, Jr, W, WN, Ru, Co, nickel (Ni), or platinum (Pt)).

The OPL 108 is deposited onto the barrier cap 128 (e.g., by spin-depositing). The OPL 108 can optionally be cured by baking at an elevated temperature, followed by reflowing to form a planarized horizontal surface. In some embodiments, the OPL 108 is an amorphous carbon (aC) film with a thickness of approximately 30 nm. However, the OPL 108 can also be a low viscosity organic polymer (e.g., a polymer including carbon, hydrogen, oxygen, and optionally nitrogen, fluorine, and silicon). In some embodiments, the thickness of the OPL 108 is between approximately 50 nm and approximately 500 nm, though other thicknesses are possible.

The hardmask layer 112 is deposited on the barrier cap 128. In some embodiments, the hardmask layer 112 is silicon nitride (SiN). The hardmask layer 112 can also be an oxide- or silicon-containing antireflection coating (SiARC). However, any material that can act as an etch stop layer can be used. Examples of these materials can include silicon, titanium nitride (TiN), titanium oxides (TiO$_x$), titanium oxynitrides (TiO$_x$N$_y$), tantalum nitride (TaN), hafnium oxides (HfO$_x$), niobium nitride (NbN), lanthanum oxide (La$_2$O$_3$), low temperature oxides (LTOs), silicon oxides (SiO$_x$), silicon oxynitrides (SiO$_x$N$_y$), zirconium oxides (ZrO$_x$), and tin oxides (SnO$_x$). In the preceding chemical formulas, "x" and "y" represent the number of oxygen or nitrogen atoms (e.g., 1, 2, or 3 atoms), respectively. The hardmask layer 112 can be deposited according to conventional deposition techniques, such as CVD, PECVD, atomic layer deposition (ALD), spin-coating, and physical vapor deposition (PVD). The hardmask layer 112 can also be made from more than one material. For example, a hardmask layer 112 having two materials can be formed by spin-coating a 20 nm SiARC layer, followed by a 10 nm SiN deposited by PECVD at approximately 200° C.

The surface of the hardmask layer 112 is kept chemically neutral (e.g., by spin-coating with a neutral layer material, such as an inert polymer) in order to promote formation of lamellae in the block copolymer. In some embodiments, a polymer brush can be applied between the hardmask 112 and the image formation layer 114. Examples of polymer brushes can include vinyl polymers, epoxy polymers, polyester polymers, polyurethane polymers, polyamide polymers, polycarbonate polymers, polyurea polymers, polyether polymers, and polyimide polymers. Polymer brushes can also improve adhesion and patterning of the image formation layer 114.

The image formation layer 114 is formed on the hardmask layer 112 surface. The image formation layer 114 includes a block copolymer having a lamellar structure formed by DSA (represented by the alternating black and gray boxes) and a resist template (represented by the white bar on the far left and far right of the layer 114). A resist is deposited onto the OPL 108, and lithographically patterned to form the template. The resist in the image formation layer 114 is illustrated as having been pre-patterned through lithographic techniques. That is, the resist is a template for further sublithographic patterning, and does not cover the entire surface of the etch stack 100. Examples of resist materials can include methacrylate polymers, phenolic-based polymers, polyesters, and hydrogen silsesquioxane (HSQ).

Methods of forming the resist can include chemical vapor deposition, plasma vapor deposition, sputtering, dip coating, spin-on coating, brushing, and spraying. However, commercially available or pre-prepared resists can also be used. The template pattern is transferred to the resist by partially covering the resist with a patterned photomask, and then applying radiation (e.g., 193 nm, X-ray radiation, EUV, electron beam radiation, etc.) to the exposed portions of the resist. The pattern is developed using standard resist patterning and development techniques, as would be understood by a person of ordinary skill in the art. This is discussed in greater detail with respect to FIG. 2. In some embodiments, the thickness of the resist ranges from approximately 30 nm to approximately 50 nm, though it can range from approximately 1 nm to approximately 500 μm.

The patterned block copolymer portion of the image formation layer 114 is formed by DSA, and provides a pattern for sublithographic etching. Examples of block copolymers that can be used can include poly(styrene)-poly (methyl methacrylate) (PS-PMMA), poly(styrene)-b-poly (methyl methacrylate) (PS-b-PMMA), poly(ethylene oxide)-poly(lactic acid) (PEO-PLA), and high chi block copolymers. However, any lamellae-forming block copolymer can be used. Additionally, block copolymers that form spheres or cylinders can be used in some embodiments. The volume fraction of each block in the block copolymer, identity of the monomers, and conditions under which DSA is carried out are examples of factors that determine the structure of the assembled block copolymer. Interactions between the block copolymer and the resist template also control the assembled structure of the block copolymer.

Figure 2:
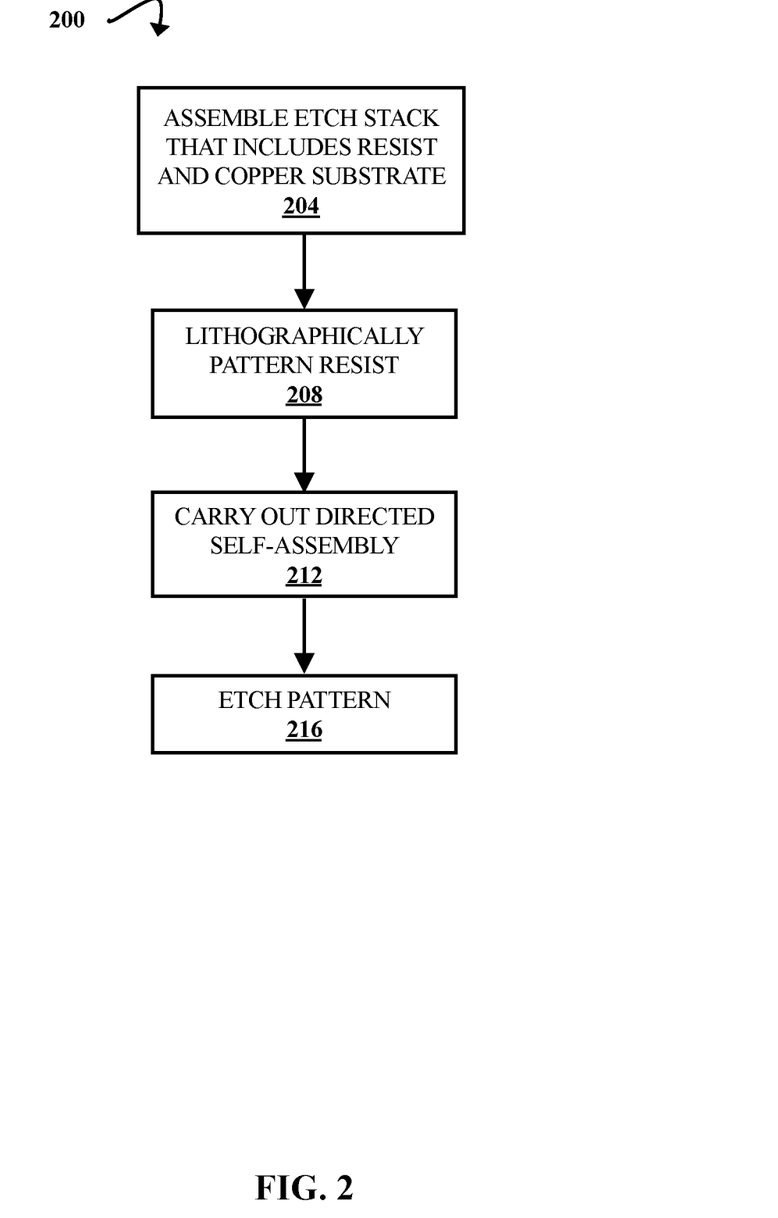
FIG. 2 is a flow diagram illustrating a process of patterning copper using directed self-assembly, according to some embodiments of the present disclosure.

FIG. 2 is a flow diagram 200 illustrating a process of forming patterned copper lines using DSA, according to some embodiments of the present disclosure. An etch stack having a copper substrate, such as the etch stack 100 of FIG. 1, is formed. This is illustrated at step 204. In addition to the copper substrate, the etch stack includes a dielectric layer, a liner layer, an organic planarizing layer (OPL), a barrier cap, a hardmask, and a resist. The process of forming the etch stack is discussed in greater detail with respect to FIG. 1. However, it should be noted that the etch stack 100 of FIG. 1 is illustrated as having a patterned resist and assembled block copolymer, though resist patterning and DSA are not carried out at step 204.

After forming the etch stack, the resist is lithographically patterned to produce a template. This is illustrated at step 208. The resist is selectively masked by a photomask that is designed with the pattern to be etched prior to DSA. An energy source, such as electromagnetic radiation or an electron beam, is applied. The unmasked sections of the resist are exposed to the energy source. When the resist is exposed to the energy source, a chemical reaction occurs so that selected sections of the resist are dissolvable in a developer, and therefore removable during a development stage in the lithographic process. Removing the dissolvable sections during the development stage creates the patterned resist.

The locations of the dissolvable sections of the resist depend upon the selection of resist material and developer. The developer is a solvent in which the resist is immersed after exposure to the energy source. Immersion in the developer allows the dissolvable sections of the resist to be removed. Removal can be aided by rinsing with a solvent after development. Resists can be categorized as either positive resists or negative resists. When a positive resist is exposed to negative tone development, the sections of the resist that were not exposed to the energy source (i.e., the masked sections) are soluble in the developer. However, when a positive resist is exposed to positive tone development, the sections that were exposed to the energy source (i.e., the unmasked sections) are soluble in the developer.

Sublithographic patterns are then formed by DSA of block copolymers on the parts of the hardmask exposed by the resist pattern template. This is illustrated at step 212. The block copolymer is typically a diblock copolymer (i.e., a block copolymer having two distinct types of monomer block), through the block copolymer can be a triblock copolymer in some embodiments. Any block copolymer capable of forming lamellae can be used. Examples of these block copolymers can include poly(styrene)-poly(methyl methacrylate) (PS-PMMA), poly(styrene)-b-poly(methyl methacrylate) (PS-b-PMMA), and poly(ethylene oxide)-poly(lactic acid) (PEO-PLA), and high chi block copolymers. Surface interactions and polymer thermodynamics result in copolymers assembled in a particular pattern. This can be controlled by the selection of polymers, substrates, templates, temperature, solvent, and lithographic conditions.

Once an image formation layer having a resist template and a self-assembled block copolymer layer has been formed (e.g., the image formation layer 108 of FIG. 1), the block copolymer layer and additional layers of the etch stack are etched using a variety of lithographic techniques. This is illustrated at step 216. The lithographic techniques vary based upon the identity of the components of the etch stack. The etching steps ultimately result in the formation of patterned copper lines. Examples of etching processes are discussed in greater detail with respect to FIGS. 3 and 4.

Figure 3:
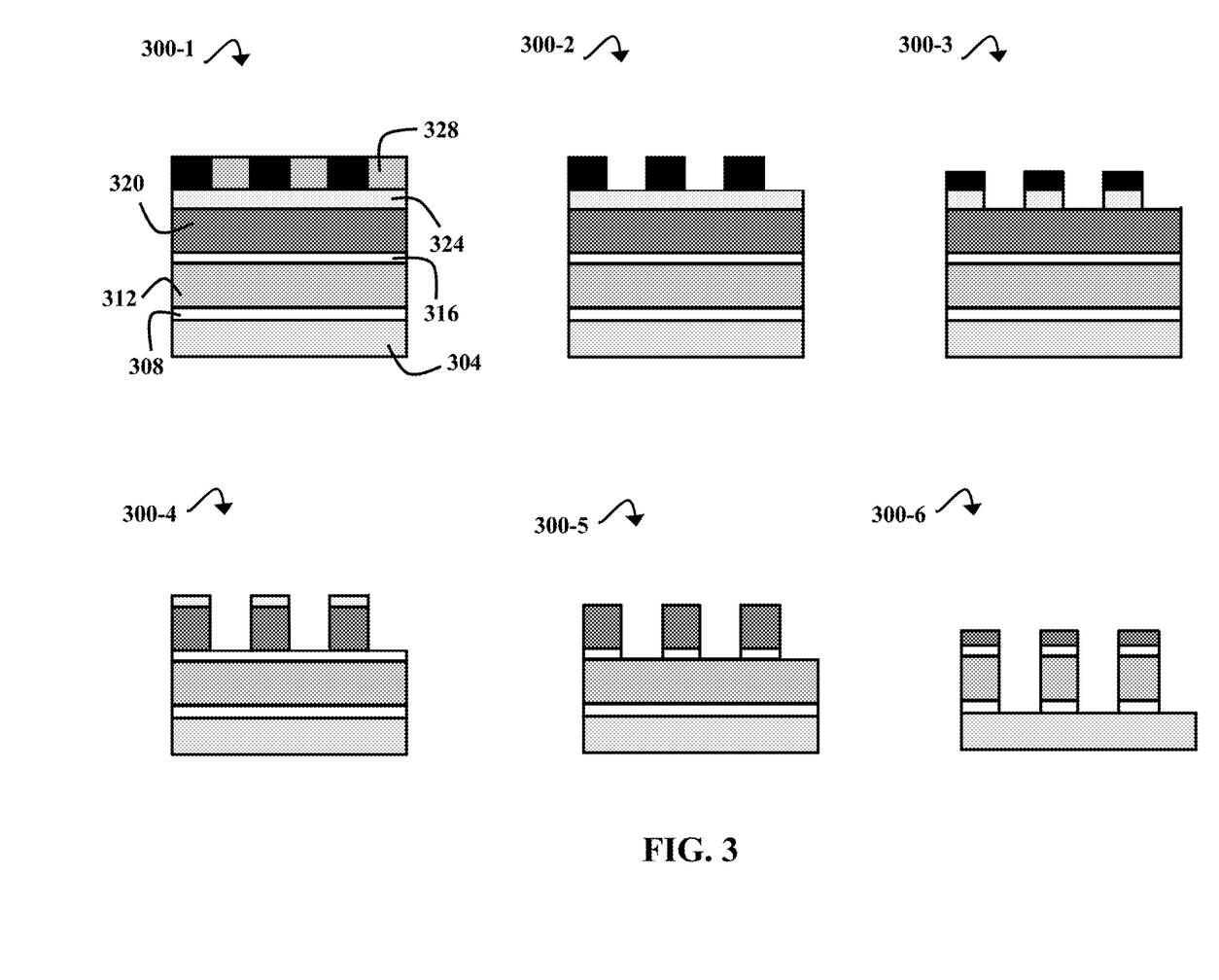
FIG. 3 is a series of schematic diagrams illustrating a first visual process of forming patterned copper lines, according to some embodiments of the present disclosure.

FIG. 3 is a series of schematic diagrams 300-1, 300-2, 300-3, 300-4, 300-5, and 300-6 (referred to collectively as 300) illustrating a first visual process of forming patterned copper lines, according to some embodiments of the present disclosure. For simplicity, reference numbers have been omitted from diagrams 300-2-300-6. However, the etch stack components in these diagrams 300-2-300-6 correspond to the numbered etch stack components of diagram 300-1, and will be referred to as such. Additionally, though specific etch stack components are discussed with respect to the diagrams 300, alternative materials can be used in some embodiments. Examples of these materials are discussed in greater detail with respect to FIG. 1.

Diagram 300-1 illustrates an etch stack having a dielectric material layer 304, a Co liner layer 308, a copper substrate 312, a TaN barrier cap 316, an aC organic planarization layer (OPL) 320, a SiN hardmask 324, and image formation layer 328 having a PS-PMMA diblock copolymer formed by DSA (e.g., a PS-PMMA block copolymer annealed at approximately 200° C. for approximately two minutes). The PMMA portions of the block copolymer are represented by the dark gray blocks, and the PS portions of the block copolymer are represented by the black boxes. The image formation layer 328 also includes an HSQ e-beam patterned resist template. However, for simplicity, the resist template is not illustrated in FIG. 3. Example processes for constructing the etch stack, patterning the resist, and assembling the block copolymer layer are discussed in greater detail with respect to FIGS. 1 and 2.

Diagram 300-2 illustrates a PMMA etching step. In this step, the image formation layer 328 is treated to remove the PMMA portions from the PS-PMMA block copolymer, thereby exposing the SiN hardmask 324. The PMMA blocks are removed by treatment with plasma. For example, an $O_2$ plasma-based etching process can be used. In some embodiments, the $O_2$ plasma is a low density plasma. Additionally, $CO-H_2$ plasma is used in some embodiments. However, any other type of plasma can be used. Removing the PMMA blocks produces a patterned block copolymer mask layer.

Diagram 300-3 illustrates a hardmask 324 etching step. In this step, the pattern in the block copolymer mask layer is transferred to the SiN hardmask 324. This pattern is etched into the hardmask with a fluorine-based plasma (e.g., $CF_4$) at a temperature at or below approximately 65° C. However, the etching can be carried out at a higher temperature in some embodiments. The hardmask 324 is etched, and the remaining PS portions of the block copolymer in the image formation layer 328 are partially removed. The hardmask 324 is etched by reactive ion etching (RIE). However, other dry etching processes can be used, such as ion beam etching, plasma etching, and laser ablation. The dry etching removes all portions of the hardmask 324 that are not covered by PS portions of the image formation layer 328, thereby exposing the corresponding underlying portions of the OPL 320.

Diagram 300-4 illustrates an OPL 320 etching step, wherein the aC layer 320 is etched. The OPL 320 is etched using standard $O_2$ plasma-based etching techniques, as would be understood by a person of ordinary skill in the art. During the etching of the OPL 320, the remaining PS portions of the image formation layer 328 are removed, and the remaining hardmask 324 portions are partially removed.

Diagrams 300-5 and 300-6 illustrate pattern transfer to the TaN barrier cap 316 and the copper substrate 312, respectively. The OPL 320 pattern is etched into the TaN barrier cap 316 by RIE. The copper substrate 312 etching step illustrated by diagram 300-6 etches the Co liner layer 308 in addition to the copper. However, portions of the OPL 320 and the TaN barrier cap 316 remain on the copper substrate 312 after it has been etched. The copper substrate 312 and Co liner 308 are also etched with RIE. However, alternative dry etching processes can be used in some embodiments. The copper substrate 312 etching produces the patterned copper lines. The copper lines can be integrated with CMOS circuits, and incorporated into various devices. This is discussed in greater detail above.

Figure 4:
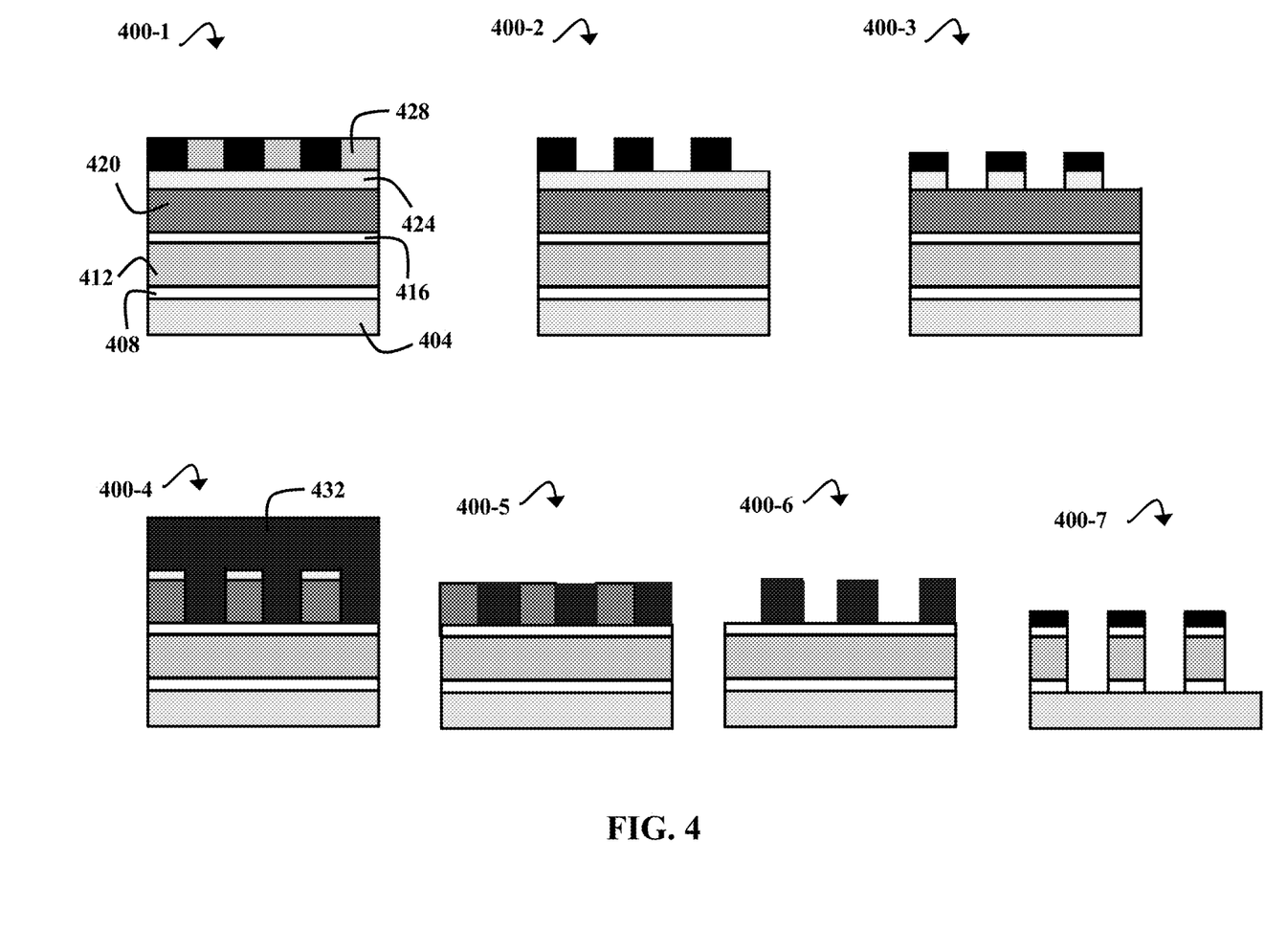
FIG. 4 is a series of schematic diagrams illustrating a first visual process of forming patterned copper lines, according to some embodiments of the present disclosure.

FIG. 4 is a series of schematic diagrams 400-1, 400-2, 400-3, 400-4, 400-5, 400-6, and 400-7 (referred to collectively as 400) illustrating a first visual process of forming patterned copper lines, according to some embodiments of the present disclosure. For simplicity, most reference numbers have been omitted from diagrams 400-2-400-7. However, the etch stack components in these diagrams 400-2-400-7 correspond to the numbered etch stack components of diagrams 400-1 and 400-4, and will be referred to as such. Additionally, though specific etch stack components are discussed with respect to the diagrams 400, alternative materials can be used in some embodiments. Examples of these materials are discussed in greater detail with respect to FIG. 1.

Diagram 400-1 illustrates an etch stack having a dielectric material layer 404, a Co liner layer 408, a copper substrate 412, a Ru barrier cap 416, an aC organic planarization layer (OPL) 420, a SiN hardmask 424, and an image formation layer 428 having a PS-PMMA diblock copolymer formed by DSA (e.g., a PS-PMMA block copolymer annealed at approximately 200° C. for approximately two minutes). The PMMA portions of the block copolymer are represented by the dark gray blocks, and the PS portions of the block copolymer are represented by the black boxes. The image formation layer 428 also includes an HSQ e-beam-patterned resist template. However, for simplicity, the resist template is not illustrated in FIG. 4. Example processes for constructing the etch stack, patterning the resist, and assembling the block copolymer are discussed in greater detail with respect to FIGS. 1 and 2.

Diagram 400-2 illustrates a PMMA etching step. In this step, the image formation layer 428 is treated with plasma to remove the PMMA portions from the self-assembled block copolymer, thereby exposing the SiN hardmask 424. For example, an $O_2$ plasma-based etching process can be used. In some embodiments, the $O_2$ plasma is a low density plasma. Additionally, CO—$H_2$ plasma is used in some embodiments. Removing the PMMA blocks produces a patterned block copolymer mask layer.

Diagram 400-3 illustrates a hardmask 424 etching step. In this step, the pattern left by the removal of the PMMA portions is transferred to the SiN hardmask 424. The pattern is etched into the hardmask 424 with a fluorine-based plasma (e.g., $CF_4$) at a temperature at or below approximately 65° C. However, the etching can be carried out at a higher temperature in some embodiments. The hardmask 424 is etched, and the remaining PS portion of the block copolymer in the image formation layer 428 is partially removed. The pattern is transferred to the hardmask 424 using reactive ion etching (RIE). Other dry etching processes that can be used can include ion beam etching, plasma etching, and laser ablation. The dry etching removes all portions of the hardmask 424 that are not covered by the image transfer layer 428, thereby exposing the corresponding underlying portions of the Ru barrier cap 416.

Diagrams 400-4 and 400-5 illustrate a tone inversion step for etching the OPL 420, wherein the remaining PS polymer portions of the image formation layer 428 are also removed. OPL 420 is first etched using standard $O_2$ plasma-based etching techniques. This is illustrated at diagram 400-4. The etched OPL 420 is then coated with TaN 432 by atomic layer deposition (ALD). However, in some embodiments, other coating materials can be used, such as a dielectric material. The TaN coating 432 is etched back to expose the surface of the OPL 420. This is illustrated at diagram 400-5. In exposing portions of the surface of the OPL 420, the etching back also removes the remaining SiN hardmask 424 material.

Diagrams 400-6 and 400-7 illustrate removal of the remaining aC of the OPL 420, and etching of the Ru cap 416, the copper substrate 412, and the Co liner layer 408. The remaining aC from the OPL 420 is removed by $O_2$-based plasma etching. This is illustrated at diagram 400-6. The removal of the aC exposes the surface of the Ru barrier cap 416, and leaves behind patterned TaN 432. The pattern from the TaN layer 432 is transferred to the remaining etch stack layers by RIE, or other dry etching techniques. This is illustrated at diagram 400-7. This dry etching process produces the patterned copper lines. The patterned copper lines can be integrated with CMOS circuits, and incorporated into various devices. This is discussed in greater detail above.

The processes discussed herein and their accompanying drawings are not to be construed as limiting. One skilled in the art would recognize that a variety of lithographic etching techniques may be used that vary in conditions, components, methods, etc., which ultimately generate patterned copper lines. In addition, the conditions can optionally be changed over the course of a process. Further, in some embodiments, processes can be added or omitted while still remaining within the scope of the disclosure, as will be understood by a person of ordinary skill in the art.

What is claimed is:

1. A process of forming patterned copper lines, comprising:
   assembling an etch stack, wherein the etch stack includes a resist, a hardmask, an organic planarizing layer (OPL), and a copper substrate, and wherein the copper substrate has been annealed at a temperature above 200° C.;
   lithographically patterning the resist to produce a template;
   forming a patterned block copolymer mask layer on the etch stack by directed self-assembly, wherein the patterned block copolymer includes a first block and a second block;
   etching portions of the block copolymer mask layer, wherein the etching removes the first block to produce a first pattern;
   etching the first pattern into the hardmask;
   partially removing the second block;
   etching the first pattern into the OPL, wherein the etching the first pattern includes removing the remainder of the second block and partially removing the patterned hardmask;
   coating the patterned OPL with a coating material;
   etching back a layer of the coating material and the remainder of the hardmask to expose the surface of the patterned OPL;
   removing the patterned OPL to produce a second pattern; and
   transferring the second pattern to the copper substrate to form the patterned copper lines, wherein the patterned copper lines have a pitch that is less than 30 nm.

2. The process of claim 1, wherein the etch stack also includes a dielectric layer, a liner layer, and a barrier layer.

3. The process of claim 1, wherein the organic planarizing layer is amorphous carbon.

4. The process of claim 1, wherein the etching the first pattern into the hardmask includes at least one reactive ion etching step.

5. The process of claim 1, wherein the etching the first pattern into the OPL includes at least one plasma-based etching step.

6. The process of claim 5, wherein the plasma-based etching step uses an $O_2$-based plasma.

7. The process of claim 1, wherein the hardmask is made of a material selected from a group consisting of silicon, silicon nitride, silicon oxide, titanium nitride, titanium oxides, titanium oxynitrides, tantalum nitride, hafnium oxides, niobium nitride, lanthanum oxide, silicon oxynitrides, zirconium oxides, and tin oxides.

8. The process of claim 1, wherein the block copolymer mask layer is a lamellae-forming block copolymer.

9. The process of claim 1, wherein the block copolymer is selected from a group consisting of poly(styrene)-poly(methyl methacrylate), poly(styrene)-b-poly(methyl methacrylate), poly(ethylene oxide)-poly(lactic acid), and a high chi block copolymer.

10. The process of claim 1, further comprising integrating the patterned copper lines with at least one complementary metal-oxide-semiconductor circuit.

* * * * *